United States Patent
Lee et al.

(10) Patent No.: US 7,995,645 B2
(45) Date of Patent: *Aug. 9, 2011

(54) APPARATUS FOR MEASURING IN-PHASE AND QUADRATURE (IQ) IMBALANCE

(75) Inventors: Kyeongho Lee, Seoul (KR); Joonbae Park, Seoul (KR); Jeong Woo Lee, Seoul (KR); Seung-Wook Lee, Seoul (KR); Eal Wan Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 700 days.

This patent is subject to a terminal disclaimer.

(21) Appl. No.: 12/027,762

(22) Filed: Feb. 7, 2008

(65) Prior Publication Data

US 2008/0212662 A1    Sep. 4, 2008

(51) Int. Cl.
    *H04B 3/46* (2006.01)
(52) U.S. Cl. .......... 375/224; 375/226
(58) Field of Classification Search .......... 375/224, 375/226
    See application file for complete search history.

(56) References Cited

U.S. PATENT DOCUMENTS

| | | | | |
|---|---|---|---|---|
| 5,949,821 A * | 9/1999 | Emami et al. | .......... | 375/235 |
| 6,009,317 A * | 12/1999 | Wynn | .......... | 455/296 |
| 6,044,112 A * | 3/2000 | Koslov | .......... | 375/235 |
| 6,330,290 B1 * | 12/2001 | Glas | .......... | 375/324 |
| 6,574,286 B2 * | 6/2003 | McVey | .......... | 375/308 |
| 6,819,910 B2 * | 11/2004 | Shi et al. | .......... | 455/126 |
| 7,020,220 B2 * | 3/2006 | Hansen | .......... | 375/324 |
| 7,130,359 B2 * | 10/2006 | Rahman | .......... | 375/316 |
| 7,151,917 B2 * | 12/2006 | Paulus | .......... | 455/302 |
| 7,158,586 B2 * | 1/2007 | Husted | .......... | 375/324 |
| 7,295,599 B1 * | 11/2007 | Karsi | .......... | 375/219 |
| 7,376,170 B2 * | 5/2008 | Scheck | .......... | 375/130 |
| 7,443,783 B2 * | 10/2008 | DeChamps et al. | .......... | 370/208 |
| 7,742,539 B2 * | 6/2010 | Fonden et al. | .......... | 375/296 |
| 2004/0203472 A1 * | 10/2004 | Chien | .......... | 455/68 |

(Continued)

OTHER PUBLICATIONS

Huang, "Gain/phase imbalance and DC offset compensation in quadrature modulators" 2002 IEEE International Symposium on Circuits and Systems, Issue Date: 2002 on pp. IV-811-IV-814 vol. 4.*

(Continued)

*Primary Examiner* — Juan A Torres
(74) *Attorney, Agent, or Firm* — Muir Patent Consulting, PLLC

(57) ABSTRACT

The present general inventive concept relates to apparatuses and/or methods for measuring an in-phase and quadrature (IQ) imbalance. In one embodiment, a signal generator can provide a first IQ signal of a DC component during a first period and the first IQ signal of a first angular frequency during a second period, an IQ up-conversion mixer can up-convert the first IQ signal by a second angular frequency during the first period and up-convert the first IQ signal by a third angular frequency during the second period to output a second IQ signal, an IQ down-conversion mixer can down-convert the second IQ signal by the third angular frequency to output a third IQ signal and an IQ imbalance detector can obtain a first IQ imbalance (e.g., Rx IQ imbalance) from the third IQ signal during the first period and a second IQ imbalance (e.g., Tx/Rx IQ imbalance) during the second period.

21 Claims, 8 Drawing Sheets

U.S. PATENT DOCUMENTS

| | | | |
|---|---|---|---|
| 2005/0078776 A1* | 4/2005 | Song et al. | 375/345 |
| 2005/0118963 A1* | 6/2005 | Chiu | 455/115.1 |
| 2005/0123064 A1* | 6/2005 | Ben-Ayun et al. | 375/295 |
| 2005/0123067 A1* | 6/2005 | Kim et al. | 375/298 |
| 2005/0157815 A1* | 7/2005 | Kim et al. | 375/302 |
| 2006/0009180 A1* | 1/2006 | Xu et al. | 455/226.1 |
| 2006/0203901 A1* | 9/2006 | Tan et al. | 375/233 |
| 2006/0256895 A1* | 11/2006 | Cho | 375/332 |

OTHER PUBLICATIONS

Nezami, "Performance assessment of baseband algorithms for direct conversion tactical software defined receivers: I/Q imbalance correction, image rejection, DC removal, and channelization," MILCOM 2002 Proceedings, vol. 1, Publication Year: 2002, pp. 369-376 vol. 1.*

* cited by examiner (a)

(b)

(c)

(d)

(a)

(b)

(c)

(d)

APPARATUS FOR MEASURING IN-PHASE AND QUADRATURE (IQ) IMBALANCE

This application claims priority under 35 U.S.C. §119 (a) of Korean Patent Application No. 10-2007-0013042, filed on Feb. 8, 2007, in the Korean Intellectual Property Office, the disclosure of which is incorporated herein by reference in its entirety.

1. FIELD OF THE INVENTION

The present general inventive concept relates to an apparatus for measuring an in-phase and quadrature (IQ) imbalance.

2. BACKGROUND OF THE INVENTION

A technique for converting a base band signal (hereinafter referred to as "BB signal") or an intermediate frequency signal (hereinafter referred to as "IF signal") to a radio frequency signal (hereinafter referred to as "RF signal") using an IQ mixer or a technique for converting the RF signal to the BB signal or the IF signal is widely used in a field of a wireless communication.

However, an IQ imbalance occurs in a real IQ mixer. The IQ imbalance can include a gain imbalance that occurs because amplitudes of an in-phase signal and a quadrature signal transmitted from a local oscillator to the IQ mixer are not identical, and a phase imbalance that occurs because the in-phase signal and the quadrature signal do not have a phase difference of 90°. When the IQ imbalance occurs, an output of the IQ mixer includes an undesirable noise component, which can result in a degradation of a signal-to-noise ratio.

U.S. Pat. No. 5,949,821 by Shahriar Emami titled "METHOD AND APPARATUS FOR CORRECTING PHASE AND GAIN IMBALANCES BETWEEN IN-PHASE (I) AND QUADRATURE (Q) COMPONENTS OF A RECEIVED SIGNAL BASED ON A DETERMINATION OF PEAK AMPLITUDES" and U.S. Pat. No. 6,044,112 by Johua L. Koslov titled "METHOD AND APPARATUS FOR CORRECTING AMPLITUDE AND PHASE IMBALANCES IN DEMODULATORS" disclose related art methods for compensating for IQ imbalance. The patents disclose methods for measuring the IQ imbalance using a received signal transmitted through a wireless communication. However, since IQ imbalance is measured using the received signal in accordance with the method disclosed by the patents, an accuracy of the measured IQ imbalance is degraded because of noise of a wireless channel included in the received signal.

U.S. Pat. No. 7,151,917 by Tod Paulus titled "APPARATUS AND METHOD FOR DERIVING A DIGITAL IMAGE CORRECTION FACTOR IN A RECEIVER" discloses another related art for compensating for an IQ imbalance. In accordance with the patent, a method for measuring the IQ imbalance by inputting a test signal to an IQ down-conversion mixer. However, the technique disclosed by the patent requires a separate test signal and/or does not disclose a Tx IQ.

SUMMARY

An object of embodiments of the application is to solve at least the above problems and/or disadvantages or to provide at least the advantages described herein in whole or in part.

Another object of the application is to provide an apparatus and method for measuring a Tx IQ imbalance and/or Rx IQ imbalance.

Another object of the application is to provide an apparatus or method for measuring an IQ imbalance where an output signal of an IQ up-conversion mixer is inputted to an IQ down-conversion mixer.

Another object of the application is to provide an apparatus for measuring an IQ imbalance wherein an output signal of an IQ up-conversion mixer is inputted to an IQ down-conversion mixer rather than measuring the IQ imbalance using a signal received through a wireless communication thereby simplifying the measuring process, and preventing an effect of a noise generated in wireless communication.

Another object of the application is to provide an apparatus or method for measuring an IQ imbalance having an additional local oscillator to be capable of measuring the Rx IQ imbalance.

To achieve objects and/or utilities of embodiments of the application in whole or in part, there is provided an apparatus for measuring an IQ imbalance, the apparatus including a signal generator to provide a first IQ signal of a DC component during a first period and the first IQ signal of a first angular frequency during a second period, an IQ up-conversion mixer to up-convert the first IQ signal by a second angular frequency during the first period and up-convert the first IQ signal by a third angular frequency during the second period to output a second IQ signal, an IQ down-conversion mixer to down-convert a sum of an I component and a Q component of the second IQ signal by the third angular frequency to output a third IQ signal, and an IQ imbalance detector to obtain an Rx IQ imbalance from the third IQ signal during the first period and a Tx/Rx IQ imbalance from the third IQ signal during the second period.

To also achieve objects and/or utilities of embodiments of the application in whole or in part, there is provided an apparatus for measuring an IQ imbalance, the apparatus including a signal generator for providing a first IQ signal of a DC component during a first period and the first IQ signal of a first angular frequency during a second period, an IQ up-conversion mixer for outputting a second IQ signal obtained by up-converting the first IQ signal by a second angular frequency during the first period and outputting the second IQ signal obtained by up-converting the first IQ signal by a third angular frequency during the second period, an IQ down-conversion mixer for outputting a third IQ signal obtained by down-converting a sum of an I component and a Q component of the second IQ signal by the third angular frequency, an Rx IQ imbalance compensator for outputting a fourth IQ signal corresponding to the third IQ signal, wherein the fourth signal having an Rx IQ imbalance of the third signal compensated for is outputted during the second period, an IQ imbalance detector for obtaining the Rx IQ imbalance from the fourth IQ signal during the first period and a Tx IQ imbalance from the fourth IQ signal during the second period.

To also achieve objects and/or utilities of embodiments of the application in whole or in part, there is provided an apparatus for measuring an IQ imbalance, the apparatus including an IQ up-conversion mixer to up-convert a first IQ signal of a DC component by a first angular frequency to output a second IQ signal, an IQ down-conversion mixer to down-convert a sum of an I component and a Q component of the second IQ signal by a second angular frequency to output a third IQ signal and an IQ imbalance detector to obtain an Rx IQ imbalance from the third IQ signal.

To also achieve objects and/or utilities of embodiments of the application in whole or in part, there is provided a method for measuring an IQ imbalance including up-converting a first IQ signal of a DC component by a first angular frequency to output a second IQ signal, down-converting a sum of an I component and a Q component of the second IQ signal by a second angular frequency to output a third IQ signal and determining an IQ imbalance from the third IQ signal, wherein the IQ imbalance is an Rx IQ imbalance, a Tx IQ imbalance, a Tx/Rx IQ imbalance or a first IQ imbalance.

To also achieve objects and/or utilities of embodiments of the application in whole or in part, there is provided an apparatus for measuring an IQ imbalance, the apparatus including an IQ up-conversion mixer to up-convert a first IQ signal of a first angular frequency by a second angular frequency to output a second IQ signal, an IQ down-conversion mixer to down-convert a sum of an I component and a Q component of the second IQ signal by the second angular frequency to output a third IQ signal and an IQ imbalance detector to obtain an IQ imbalance from the third IQ signal.

To also achieve objects and/or utilities of embodiments of the application in whole or in part, there is provided an apparatus for measuring an IQ imbalance, the apparatus including an IQ up-conversion mixer for outputting a second IQ signal obtained by up-converting a first IQ signal of a first angular frequency by a second angular frequency, an IQ down-conversion mixer for outputting a third IQ signal obtained by down-converting a sum of an I component and a Q component of the second IQ signal by the second angular frequency, an Rx IQ imbalance compensator for outputting a fourth IQ signal having an Rx IQ imbalance of the third signal compensated for, and an IQ imbalance detector for obtaining an Tx IQ imbalance from the third IQ signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The embodiments will be described in detail with reference to the following drawings in which like reference numerals refer to like elements wherein.

DETAILED DESCRIPTION OF EMBODIMENTS

Embodiments according to the present general inventive concept will be described with reference to the accompanying drawings. Such embodiments are exemplary and not to be construed as limiting. The interpretations of the terms and wordings used in description and claims should not be limited to common or literal meanings. Many alternatives, modifications, and variations will be apparent to those skilled in the art.

Figure 1:
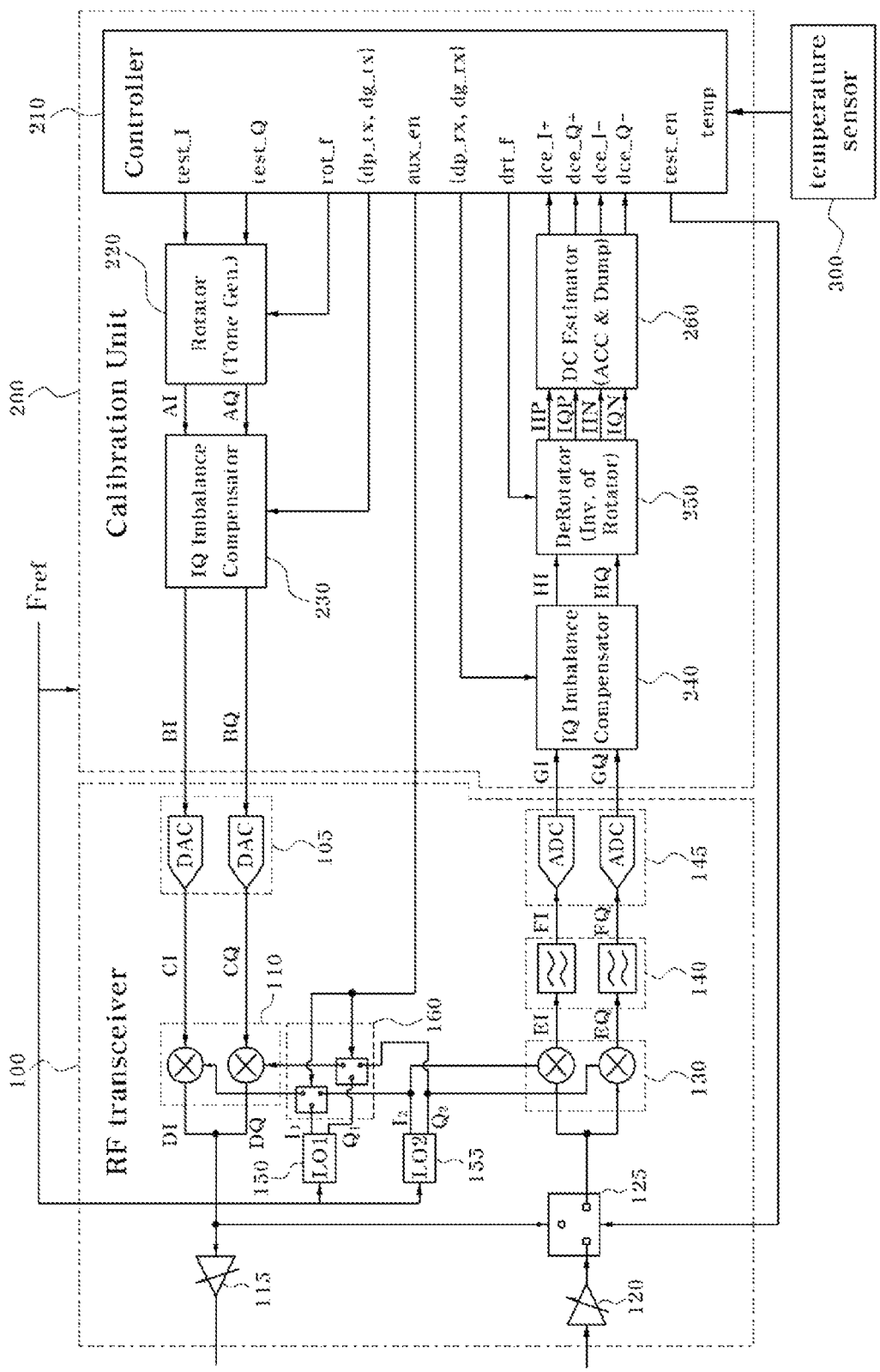
FIG. 1 is a diagram illustrating a transceiving circuit in accordance with an embodiment of the application.

FIG. 1 is a diagram illustrating a transceiving circuit in accordance with a an embodiment of the application. As illustrated to FIG. 1, the transceiving circuit can include an RF transceiver 100 and a calibration unit 200.

The RF transceiver 100 can include an IQ DAC (IQ digital-to-analog converter) 105, an IQ up-conversion mixer 110, a power amplifier 115, a low noise amplifier 120, a feedback switch 125, an IQ down-conversion mixer 130, an IQ filter 140, an IQ ADC (IQ analog-to-digital converter) 145, a first local oscillator 150, a second local oscillator 155 and an IQ switch 160.

The IQ DAC 105 converts digital IQ signals BI and BQ being outputted from the calibration unit 200 to an analog IQ signal. The IQ DAC 105 may include two DACs, wherein one of the DACs is an I channel DAC and the other is a Q channel DAC. An exemplary circuit including the I channel DAC and the Q channel DAC will be referred to as the IQ DAC 105. Similarly, an exemplary circuit including an I channel up-conversion mixer and a Q channel up-conversion mixer will be referred to as the IQ up-conversion mixer 110, and an exemplary circuit including an I channel down-conversion mixer and a Q channel down-conversion mixer will be referred to as the IQ down-conversion mixer 130. In addition, exemplary circuits such as a circuit including an I channel filter and a Q channel filter will be referred to as the IQ filter 140, a circuit including an I channel ADC and a Q channel ADC will be referred to as the IQ ADC 145, and a circuit including an I channel switch and a Q channel switch will be referred to as the IQ switch 160.

The IQ up-conversion mixer 110 up-converts IQ signals CI and CQ transmitted from the IQ DAC 105 to IQ signals DI and DQ, for example, of an RF band. In order to achieve this, the IQ up-conversion mixer 110 combines or multiplies the I channel signal CI being outputted from the IQ DAC 105 to one of a first in-phase signal I1 and a second in-phase signal I2 selected by the IQ switch 160. In addition, the IQ up-conversion mixer 110 multiplies the Q channel signal CQ being outputted from the IQ DAC 105 to one of a first quadrature signal Q1 and a second quadrature signal Q2 selected by the IQ switch 160.

The power amplifier 115 amplifies a transmission signal (e.g., RF) corresponding to a sum of IQ outputs DI and DQ of the IQ up-conversion mixer 110. The amplified transmission RF signal may be transmitted to an antenna (not shown) or the like via a duplexer (not shown) for instance.

The low noise amplifier 120 subjects a received signal (e.g., RF signal) to a low-noise amplification. The received RF signal may be transmitted to the low noise amplifier 120 via the antenna and the duplexer for instance.

The feedback switch 125 can form a feedback loop between a transmission path and a reception path. For example, the feedback switch 125 can feed back the transmission RF signal to the IQ down-conversion mixer 130 during an IQ imbalance measurement period and feed the received RF signal back to the IQ down-conversion mixer 130 during a normal operating period. While an exemplary feedback path formed between an input stage of the power amplifier 115 and an output stage of the low noise amplifier 120 is shown, various modifications are possible to transmit the transmission signal (e.g., RF signal) to the IQ down-conversion mixer 130. For instance, when the feedback path may be formed between an output stage of the power amplifier 115 and an input stage of the low noise amplifier 120. The feedback switch 125 may be controlled by a control signal (e.g., test_en) from a controller 210.

The IQ down-conversion mixer 130 converts the RF signal transmitted from the feedback switch 125 to a BB signal or an IF signal. In order to achieve this, the IQ down-conversion mixer 130 can combine or multiply the RF signal transmitted from the feedback switch 125 to a second in-phase signal I2 and the RF signal transmitted from the feedback switch 125 to a second quadrature signal Q2.

The IQ filter 140 is preferably disposed between the IQ down-conversion mixer 130 and the IQ ADC 145, and may include a low pass filter, a band pass filter or the like.

The IQ ADC 145 converts analog signals FI and FQ being outputted from the IQ filter 140 to digital signals GI and GQ.

The first local oscillator 150 can generate the first in-phase signal I1 and the first quadrature signal Q1 (hereinafter a "first LO signal").

The second local oscillator 155 can generate the second in-phase signal I2 and the second quadrature signal Q2 (hereinafter a "second LO signal"). A frequency of the second in-phase signal I2 and the second quadrature signal Q2 differs from that of the first in-phase signal I1 and the first quadrature signal Q1 by a predetermined frequency. For instance, the frequency of the second in-phase signal I2 and the second quadrature signal Q2 may be 1 MHz smaller than that of the first in-phase signal I1 and the first quadrature signal Q1.

The IQ switch 160 can transmit one of the first in-phase signal I1 and the second in-phase signal I2 selected by a control signal (e.g., control signal aux_en) of the controller 210 to the IQ up-conversion mixer 110, and transmit one of the first quadrature signal Q1 and the second quadrature signal Q2 selected by the control signal to the IQ up-conversion mixer 110. The IQ switch 160 can transmit the second in-phase signal I2 and the second quadrature signal Q2 to the IQ up-conversion mixer 110 since the IQ up-conversion mixer 110 and the IQ down-conversion mixer 130 should multiply a same frequency during the normal operating period (in case of time division duplex) and a period of measuring a Tx/Rx IQ imbalance (or a period of measuring a Tx IQ imbalance). The IQ switch 160 can transmit the first in-phase signal I1 and the first quadrature signal Q1 to the IQ up-conversion mixer 110 since the IQ up-conversion mixer 110 and the IQ down-conversion mixer 130 should multiply different frequencies during the period of measuring an Rx IQ imbalance.

The calibration unit 200 can include the controller 210, a rotator 220, a Tx IQ imbalance compensator 230, an Rx IQ imbalance compensator 240, a derotator 250 and a DC estimator 260. It is preferable that a clock signal being inputted to the calibration unit 200 and a clock signal being inputted to the first local oscillator 150 and the second local oscillator 155 are from a single clock source. As a result, a derotating frequency carried out in the derotator 250 may be controlled. The calibration unit 200 may be embodied in various ways. For example, in one embodiment, the controller 210, the rotator 220, the Tx IQ imbalance compensator 230, the Rx IQ imbalance compensator 240, the derotator 250 and the DC estimator 260 may be embodied by separate digital circuits. In another embodiment, the calibration unit 200 may be embodied using a DSP (digital signal processor) or an MCU (microcontroller unit). In such case, each of the controller 210, the rotator 220, the Tx IQ imbalance compensator 230, the Rx IQ imbalance compensator 240, the derotator 250 and the DC estimator 260 may stand for an operation carried out by the DSP or MCU.

The controller 210 can control the feedback switch 125, the IQ switch 160, the rotator 220, the Tx IQ imbalance compensator 230, the Rx IQ imbalance compensator 240, the derotator 250 and the DC estimator 260 in order to measure the Rx IQ imbalance and Tx/Rx IQ imbalance (or the Tx IQ imbalance). The controller 210 may receive a signal temp corresponding to a temperature from a temperature sensor 300 to re-carry out a process of measuring the IQ imbalance in accordance with a temperature change. For example, the IQ balance may be measured periodically, when a temperature change is greater than a prescribed amount, based on operator command or the like.

The rotator 220 rotates IQ signals (e.g., test_I and test_Q) of a DC component by an amount of predetermined frequency to generate a tone. The predetermined frequency can be determined by a control signal (e.g., control signal rot_f) transmitted from the controller 210. During the normal operating period and the period of measuring the Rx IQ imbalance, the rotator 220 is preferably not in operation. For example, during these periods, the rotator 220 outputs the IQ signals test_I and test_Q without the rotation. The rotator 220 can generate the predetermined tone during the period of measuring the Tx/Rx IQ imbalance (or the Tx IQ imbalance).

The Tx IQ imbalance compensator 230 can compensate for the Tx IQ imbalance. For instance, the Tx IQ imbalance compensator 230 is not in operation during the period of measuring the IQ imbalance (e.g., outputs the signal transmitted from the rotator 220 as is), and is in operation during the normal operating period. For example, it is preferable that a signal to be transmitted via the antenna during the normal operating period is transmitted to the power amplifier 115 via the Tx IQ imbalance compensator 230, the IQ DAC 105 and the IQ up-conversion mixer 110.

The Rx IQ imbalance compensator 240 can compensate for the Rx IQ imbalance. For instance, the Rx IQ imbalance compensator 240 is not in operation during the period of measuring the Rx IQ imbalance (e.g., outputs the signal transmitted from the IQ ADC 145 as is), and is in operation during the normal operating period. In addition, the Rx IQ imbalance compensator 240 is not in operation during the period of measuring the Tx/Rx IQ imbalance, and is in operation during the period of measuring the Tx IQ imbalance. It is preferable that a signal received via the antenna during the normal operating period is compensated for the Rx IQ imbalance via the Rx IQ imbalance compensator 240.

The derotator 250 can derotate signals HI and HQ being outputted from the Rx IQ imbalance compensator 240 by an amount of a predetermined frequency. For instance, the derotator 250 is not in operation during the normal operating period (e.g., outputs a signal transmitted from the Rx IQ imbalance compensator 240 without the rotation). During the period of measuring the Rx IQ imbalance, the derotator 250 can derotate the IQ signals HI and HQ being inputted thereto to output IQ signals IIP and IQP obtained by derotating the IQ signals HI and HQ by an amount of ΔF and IQ signals IIN and IQN obtained by derotating the IQ signals HI and HQ by an amount of −ΔF, where F1 is a frequency of a signal generated by the first local oscillator 150, F2 is a frequency of a signal generated by the second local oscillator 155, and ΔF is [F1−F2]. In addition, during the period of measuring the Tx/Rx IQ imbalance (or the Tx IQ imbalance), the derotator 250 outputs the IQ signals IIP and IQP obtained by derotating the IQ signals HI and HQ being inputted to the derotator 250 by an amount of ΔF and IQ signals IIN and IQN obtained by derotating the IQ signals HI and HQ by an amount of −ΔF, where ΔF is a frequency of a signal generated by the rotator 220.

The DC estimator 260 can determine or extract a DC component of the IQ signals IIP, IQP, IIN and IQN being outputted from the derotator 250. The DC estimator 260 may be embodied using the low pass filter, an accumulator or the like. When the low pass filter is used, each input signal can be outputted after passing through the low pass filter. When the accumulator is used, each input signal can be outputted by passing through the accumulator.

Figure 2:
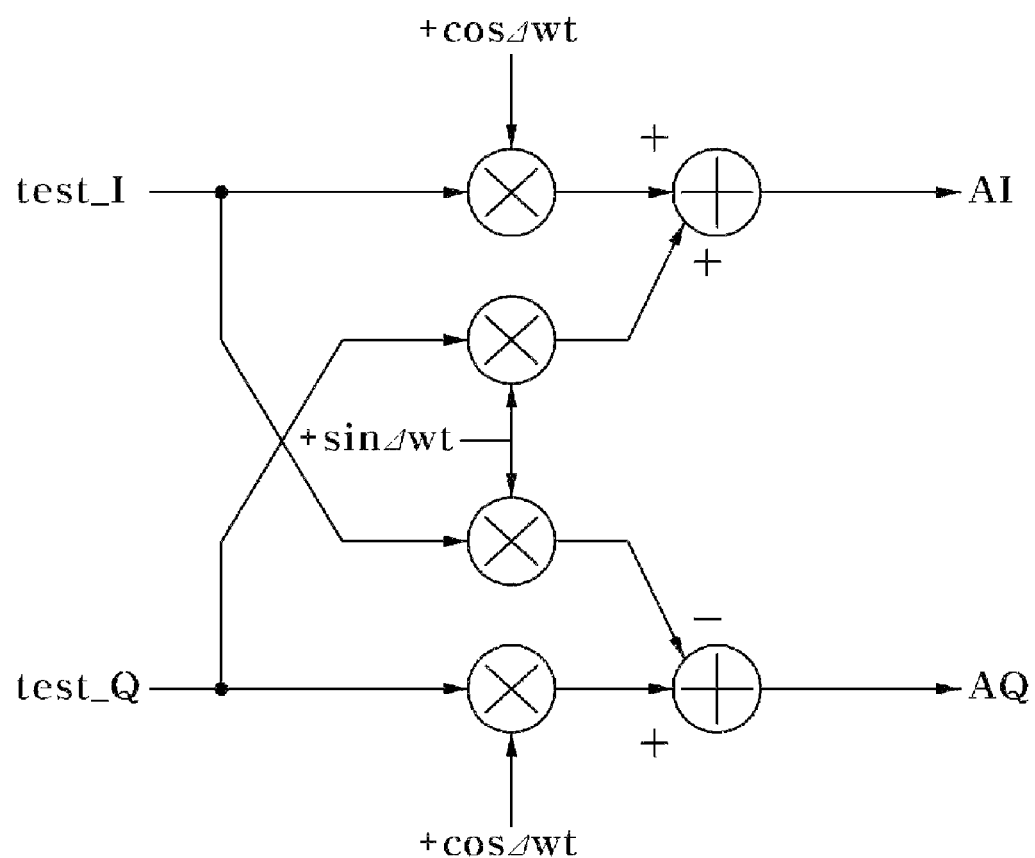
FIG. 2 is a diagram illustrating an example of a rotator of FIG. 1.

FIG. 2 is a diagram illustrating an example of a rotator, which may be used for the rotator 220 of FIG. 1. As illustrated in FIG. 2, the rotator 220 can include four adders, one multiplier and one subtractor. The rotator 220 carries out an operation expressed in equation 1, for example by including components shown.

$$AI = (\text{test\_}I \times \cos(\Delta\omega \times t)) + (\text{test\_}Q \times \sin(\Delta\omega \times t))$$

$$AQ = (\text{test\_}Q \times \cos(\Delta\omega \times t)) - (\text{test\_}I \times \sin(\Delta\omega \times t)) \quad \text{[Equation 1]}$$

In accordance with Equation 1, $\Delta\omega$ represents an angular frequency of the tone that is to be outputted by the rotator 220. The controller 210 can output a control signal (e.g., a control signal rot_f) that sets $\Delta\omega$ to zero during the period of measuring the Rx IQ imbalance, and outputs the control signal that sets $\Delta\omega$ to non-zero (a positive value or an negative value) during the period of measuring the Tx/Rx IQ imbalance (or Tx IQ imbalance).

Since a function of the rotator 220 is to generate the tone having the predetermined angular frequency, a constitution of the rotator 220 is not limited to FIG. 2. For instance, the rotator 220 may be configured to simply output $\cos(\Delta\omega \times t)$ and $-\sin(\Delta\omega \times t)$.

Figure 3:
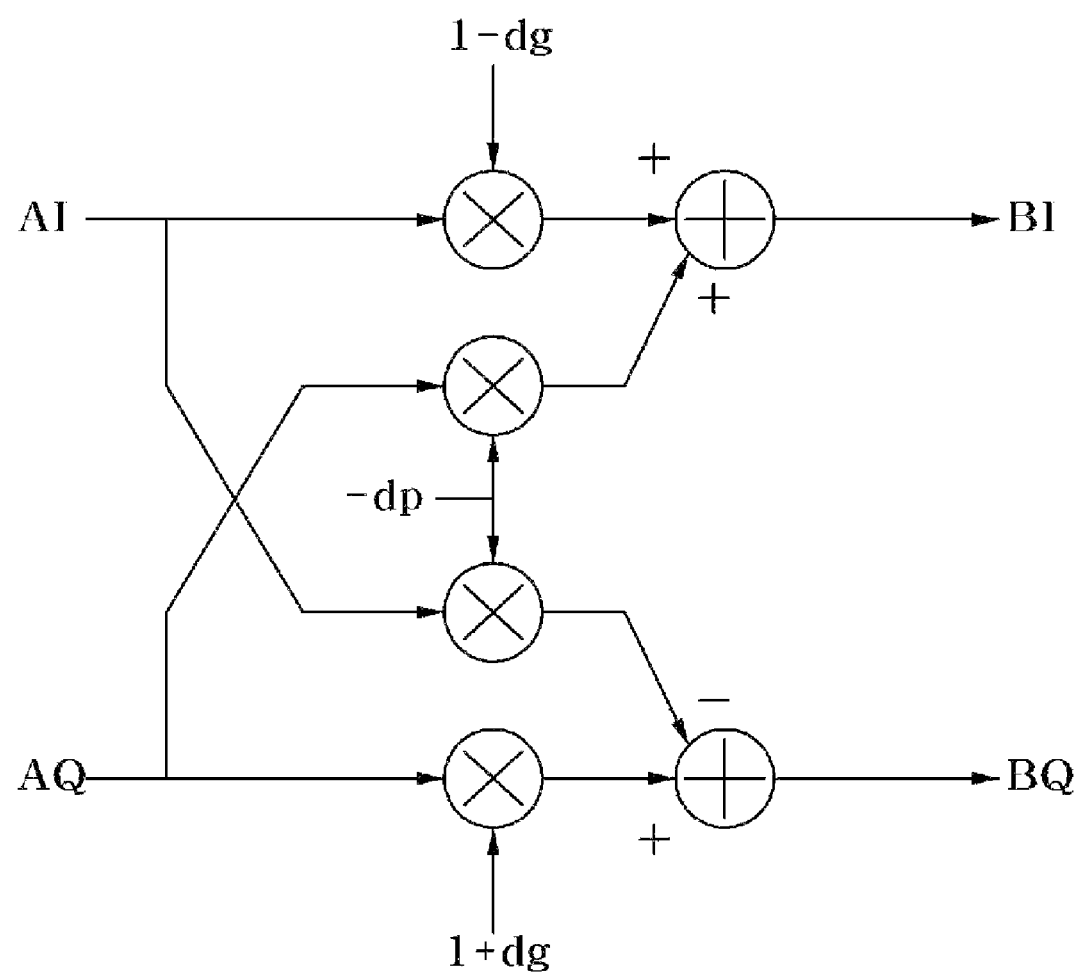
FIG. 3 is a diagram illustrating an example of a Tx IQ imbalance compensator of FIG. 1.

FIG. 3 is a diagram illustrating an example of a compensator, which may be used for the Tx IQ imbalance compensator 230 of FIG. 1. As illustrated in FIG. 3, the Tx IQ imbalance compensator 230 can include four adders and two multipliers. The Tx IQ imbalance compensator 230 carries out an operation expressed in equation 2, for example by including components shown.

$$BI = (AI \times (1 - dg)) - (AQ \times dp)$$

$$BQ = (AQ \times (1 + dg)) - (AI \times dp) \quad \text{[Equation 2]}$$

In Equation 2, dg represents a value corresponding to a control signal (e.g., control signal dg_tx) transmitted from the controller 210, which corresponds to a gain error due to the Tx IQ imbalance, and dp represents a value corresponding to a control signal (e.g., control signal dp_tx) transmitted from the controller 210, which corresponds to a phase error due to the Tx IQ imbalance. A constitution of the Tx IQ imbalance compensator 230 shown in FIG. 3 is an example of a compensator when the IQ output signals DI and DQ of the IQ up-conversion mixer 110 are illustrated in Equation 3.

$$DI = CI \times (1 + dg) \times \cos(\omega \times t - dp)$$

$$DQ = CQ \times (1 - dg) \times \sin(\omega \times t + dp) \quad \text{[Equation 3]}$$

In Equation 3, $\omega$ can represent an angular frequency of an in-phase signal and a quadrature signal being inputted to the IQ up-conversion mixer 110.

However, the constitution of the Tx IQ imbalance compensator 230 is not limited to that of FIG. 3, and for example, may be varied as expressed in Equations 4 and 5.

$$BI = AI - (AQ \times dp)$$

$$BQ = (AQ - (AI \times dp)) \times (1 + 2 \times dg) \quad \text{[Equation 4]}$$

$$BI = (AI - (AQ \times dp)) \times (1 - 2 \times dg)$$

$$BQ = AQ - (AI \times dp) \quad \text{[Equation 5]}$$

The Rx IQ imbalance compensator 240 may be configured similar to the Tx IQ imbalance compensator 230. However, in the Rx IQ imbalance compensator 240, dg is a value corresponding to a control signal (e.g., a control signal dg_rx) transmitted from the controller 210 that corresponds to the gain error due to the Rx IQ imbalance while dp is a value corresponding to a control signal (e.g., a control signal dp_rx) transmitted from the controller 210 that corresponds to the phase error due to the Rx IQ imbalance.

Figure 4:
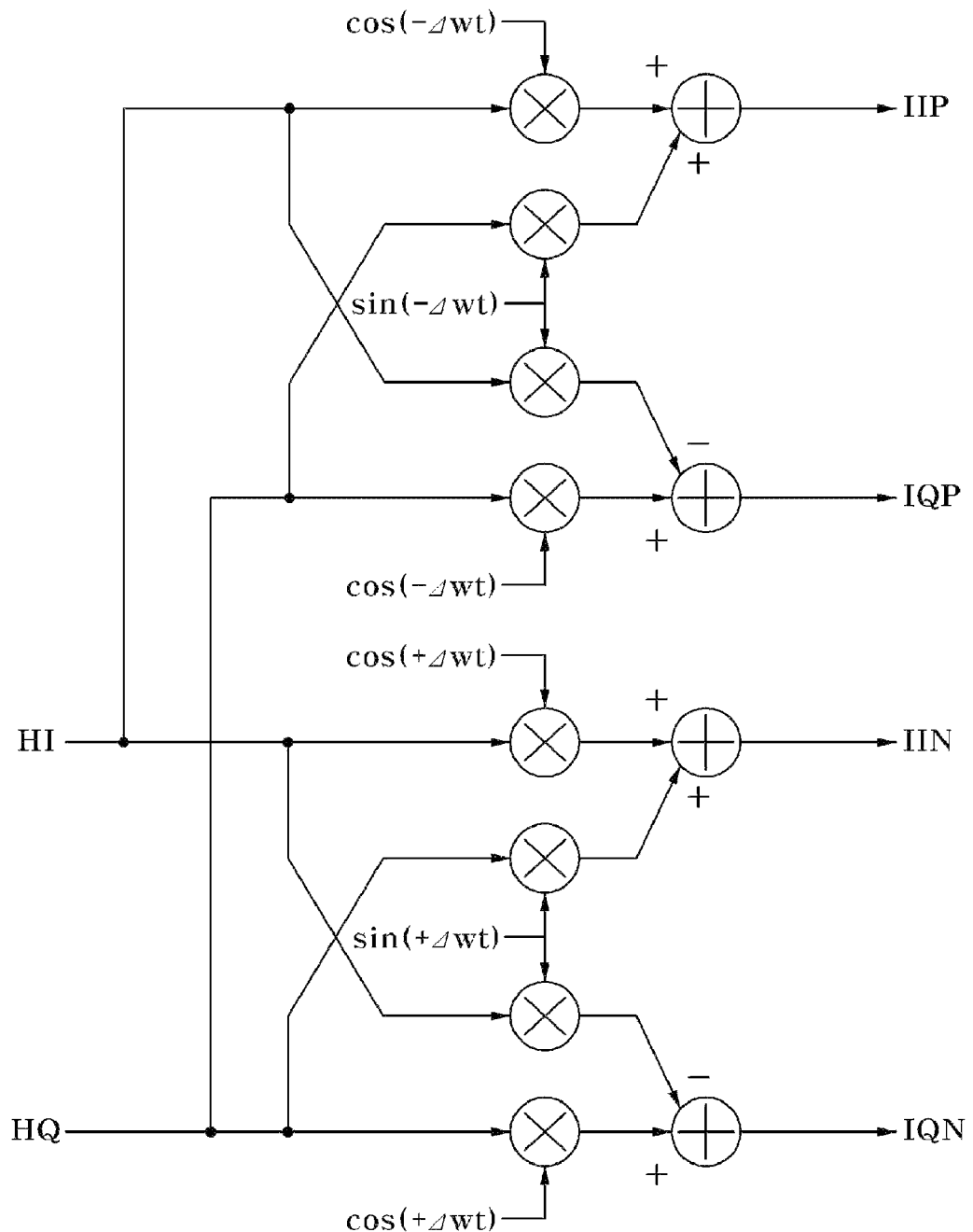
FIG. 4 is a diagram illustrating an example of a derotator of FIG. 1.

FIG. 4 is a diagram illustrating an example of a derotator, which may be used for the derotator 250 of FIG. 1. As illustrated in FIG. 4, the derotator 250 can include eight multipliers, two adders and two subtractors. The derotator 250 carries out an operation expressed in equation 6, for example by including components shown.

$$IIP = (HI \times \cos(-\Delta\omega \times t)) + (HQ \times \sin(-\Delta\omega \times t))$$

$$IQP = (HQ \times \cos(-\Delta\omega \times t)) - (HI \times \sin(-\Delta\omega \times t))$$

$$IIN = (HI \times \cos(\Delta\omega \times t)) + (HQ \times \sin(\Delta\omega \times t))$$

$$IQN = (HQ \times \cos(\Delta\omega \times t)) - (HI \times \sin(\Delta\omega \times t)) \quad \text{[Equation 6]}$$

The controller 210 can output a control signal (e.g., a control signal drt_f) during the period of measuring the Rx IQ imbalance so that $\Delta\omega$ has a value obtained by subtracting the angular frequency of the second local oscillator 155 from that of the first local oscillator 150, and output the control signal drt_f during the period of measuring the Tx/Rx IQ imbalance (or the Tx IQ imbalance) so that $\Delta\omega$ is the angular frequency of the tone generated by the rotator 220.

Therefore, IIP and IQP obtained by derotating the input signals HI and HQ by an amount of $\Delta\omega$ can correspond to signals without the IQ imbalance (hereinafter referred to as a "wanted signal"), and IIN and IQN obtained by derotating the input signals HI and HQ by an amount of $-\Delta\omega$ can correspond to image signals generated due to the IQ imbalance (hereinafter referred to as a "image signal").

For example, during the period of measuring the Rx IQ imbalance, $\Delta\omega$ corresponds to the value obtained by subtracting the angular frequency of the second local oscillator 155 from that of the first local oscillator 150, IIP and IQP correspond to the wanted signal, and IIN and IQN corresponds to the image signals generated due to the IQ imbalance of the IQ down-conversion mixer 130. In addition, during the period of measuring the Tx/Rx IQ imbalance, $\Delta\omega$ corresponds to angular frequency of the tone generated by the rotator 220, IIP and IQP correspond to the wanted signal, and IIN and IQN corresponds to the image signals generated due to the IQ imbalance of the IQ up-conversion mixer 110 and the IQ down-conversion mixer 130. Moreover, during the period of measuring the Tx IQ imbalance, $\Delta\omega$ corresponds to angular frequency of the tone generated by the rotator 220, IIP and IQP correspond to the wanted signal, and IIN and IQN corresponds to the image signals generated due to the IQ imbalance of the IQ up-conversion mixer 110.

Since IIP and IQP can include a signal (having an angular frequency of $\Delta\omega$) other than the wanted signal, IIN and IQN can include a signal (having the angular frequency of $\Delta\omega$) other than the image signal, such high frequency signals should be removed by the DC estimator 260 that receives the output of the derotator 250.

The derotator 250 may be variously or diversely embodied. For instance, a number of the multipliers and the adders may be reduced through multiplexing. For example, a single rotator may be used to embody the DC estimator 260 instead of two rotators in contrast to an embodiment illustrated in FIG. 4. In such case, IIP and IQP obtained by derotating the input signals HI and HQ by $\Delta\omega$ can be outputted during a first period, and IIN and IQN obtained by derotating the input signals HI and HQ by −Δω can be outputted during a second period.

Figure 5:
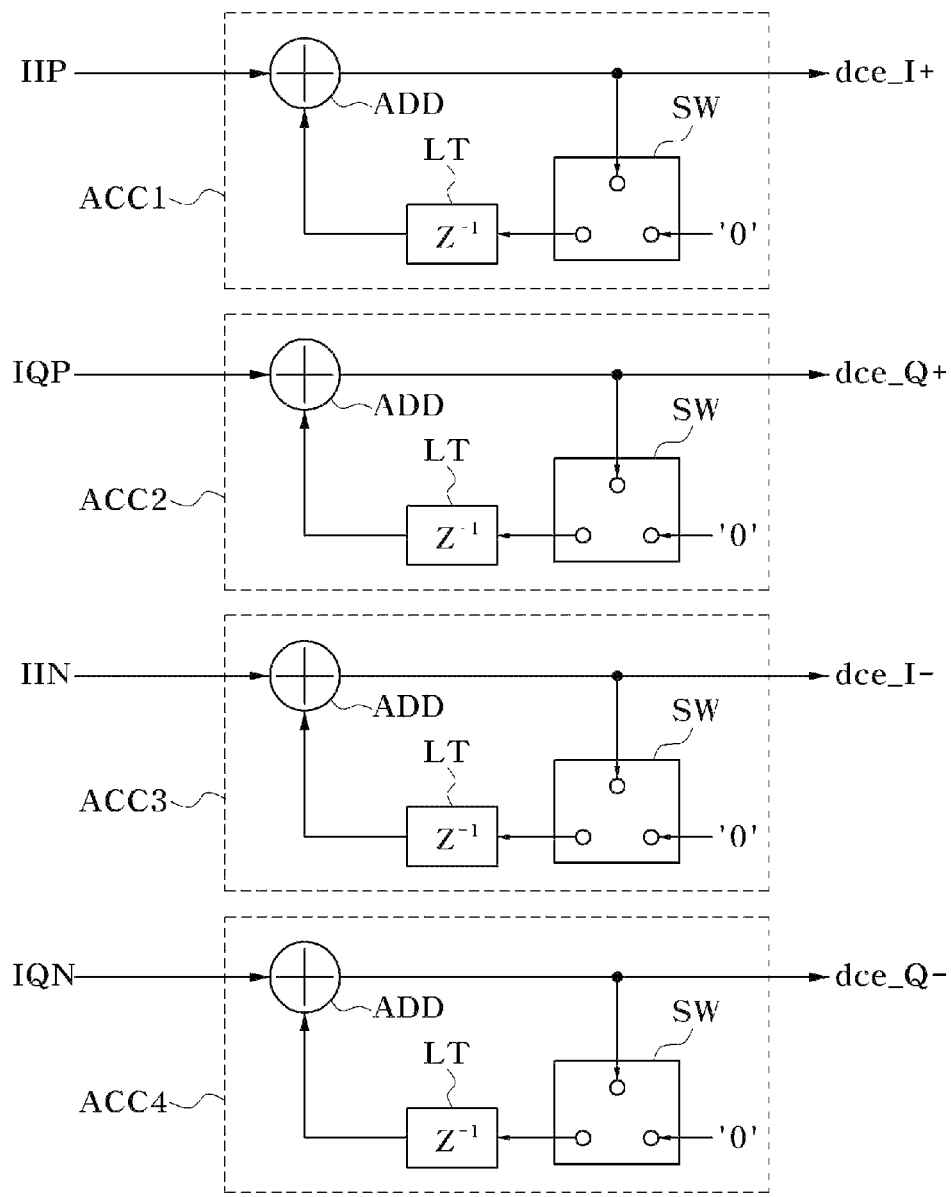
FIG. 5 is a diagram illustrating an example where an accumulator includes a DC estimator.

FIG. 5 is a diagram illustrating an example where an accumulator is used as a DC estimator 260. As illustrated in FIG. 5, the DC estimator 260 can include four accumulators ACC1, ACC2, ACC3 and ACC4. Each of the accumulators ACC1, ACC2, ACC3 and ACC4 preferably outputs a result obtained by accumulating the input signal IIP, IQP, IIN or IQN. In order to achieve this, each of the accumulators ACC1, ACC2, ACC3 and ACC4 may comprise an adder Add, a switch SW and a latch LT.

However, the DC estimator 260 may reduce a number of the accumulators via multiplexing similar to the derotator 250.

Figure 6:
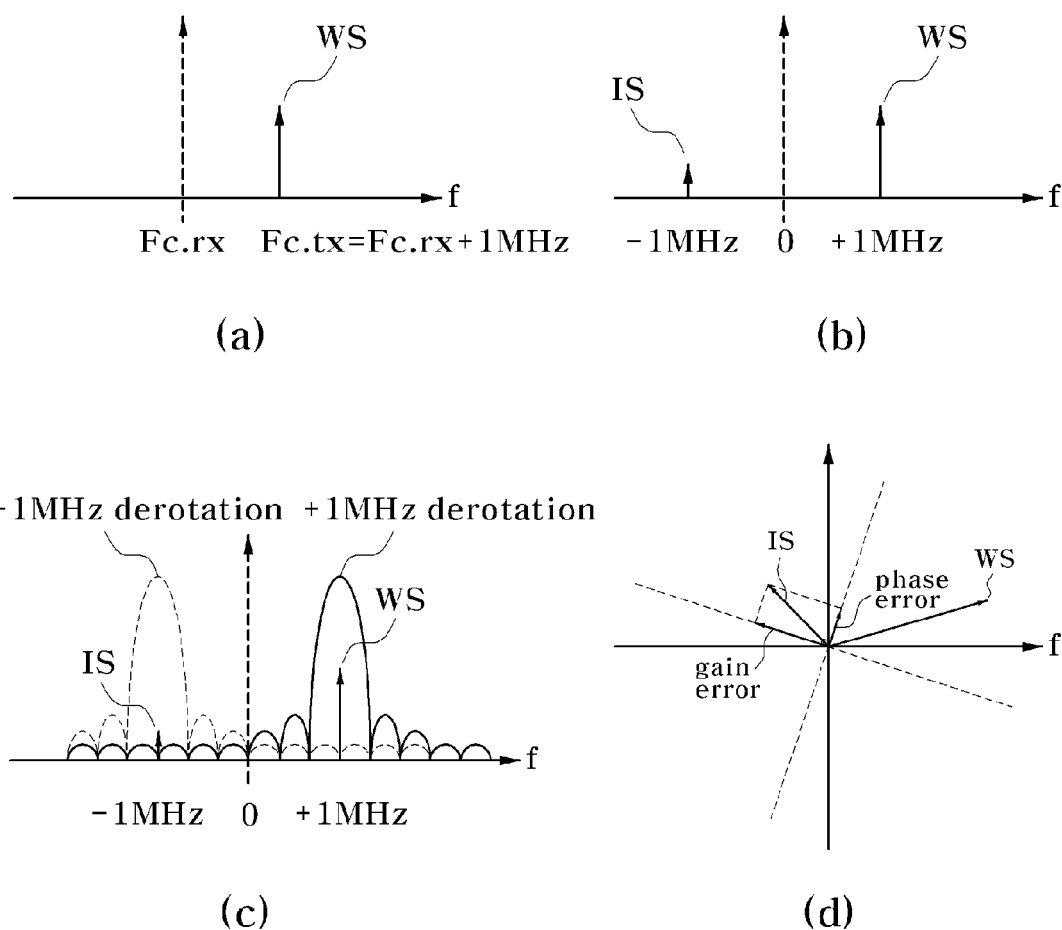
FIG. 6 is a diagram illustrating a principle for measuring an Rx IQ imbalance in accordance with the present general inventive concept.

FIG. 6 is a diagram illustrating exemplary operations for measuring the Rx IQ imbalance in accordance with the present general inventive concept. An exemplary embodiment of a method for measuring the IQ imbalance is described using and may be applied to the embodiment of FIG. 1, however, such a method embodiment is not intended to be limited thereby.

In order to measure the IQ imbalance, test_I and test_Q of the DC component are outputted from the controller 210 while the rotator 220 and the Tx IQ imbalance compensator 230 are not in operation, e.g. while the control signals rot_f, dp_tx and dg_tx are applied such that the rotation is not carried out in the rotator 220 and the Tx IQ imbalance is not compensated for in the Tx IQ imbalance compensator 230. Therefore, the IQ signals BI and BQ of the DC component are inputted to the first local oscillator 150. In addition, the control signal test_en is applied to the feedback switch 125 so as to form the feedback path, and a control signal aux_en is applied to the IQ switch 160 so that the output of the first local oscillator 150 is inputted to the IQ up-conversion mixer 110. Moreover, the control signals dp_rx and dg_rx are applied so that the Rx IQ imbalance compensator 240 does not operate, e.g. the Rx IQ imbalance is not compensated for in the Rx IQ imbalance compensator 240. In addition, a control signal drt_f is applied to the derotator 250 so that the derotator 250 outputs the IQ signals IIP and IQP obtained by derotating the input IQ signals HI and HQ by an amount of [F1-F2], and the IQ signals IIN and IQN obtained by derotating the input IQ signals HI and HQ by an amount of −[F1-F2] where F1 is an output frequency of the first local oscillator and F2 is an output frequency of the second local oscillator.

FIG. 6(a) illustrates an output signal of the IQ up-conversion mixer 110. As shown, Fc.tx represents the frequency of the in-phase signal and the quadrature signal transmitted to the IQ up-conversion mixer 110, e.g., the output frequency F1 of the first local oscillator, and Fc.rx represents the frequency of the in-phase signal and the quadrature signal transmitted to the IQ down-conversion mixer 130, e.g. the output frequency F2 of the second local oscillator.

In addition, FIG. 6(a) illustrates the output signal when [F1-F2] is 1 MHz. Since the IQ signals CI and CQ of the DC component are inputted to the IQ up-conversion mixer 110, the image signal due to the Tx IQ imbalance (the IQ imbalance of the IQ up-conversion mixer 110) is not generated in the IQ output signals DI and DQ of the IQ up-conversion mixer 110 and only the wanted signal WS is generated as shown in FIG. 6(a).

FIG. 6(b) illustrates an output signal of the IQ down-conversion mixer 130. As shown, the desired signal WS is positioned at [F1-F2], e.g. 1 MHz, and the image signal IS due to the Rx IQ imbalance (the IQ imbalance of the IQ down-conversion mixer 130) is positioned at −[F1-F2], e.g. −1 MHz. Therefore, when the output signal of the IQ down-conversion mixer 130 is derotated by the amount of [F1-F2], e.g. 1 MHz and a DC signal is then extracted, the wanted signal WS may be obtained. Moreover, when the output signal of the IQ down-conversion mixer 130 is derotated by the amount of −[F1-F2], e.g. −1 MHz and the DC signal is then extracted, the image signal IS may be obtained. The derotation and the extraction of the DC signal can be carried out by the derotator 250 and the DC estimator 260, respectively.

FIG. 6(c) illustrates an exemplary filter characteristic of the derotator 250 and the DC estimator 260. In accordance with the filter characteristic in case of the derotation of [F1-F2], e.g. +1 MHz shown in a solid line, the wanted signal WS can be passed through but the image signal IS can be blocked. In addition, in accordance with the filter characteristic in case of the derotation of −[F1-F2], e.g. −1 MHz shown in a dotted line, the image signal IS can be passed through but the wanted signal WS can be blocked. Thus, when the derotator 250 and the DC estimator 260 are used, the wanted signal WS and the image signal IS may be selected without using a separate sharp analog filter.

FIG. 6(d) illustrates vectors being outputted from the DC estimator 260, e.g. the vectors IIP and IQP of the wanted signal WS and the vectors IIN and IQN of the image signal IS. The vectors IIN and IQN of the image signal IS may be expressed in terms of the vectors IIP and IQP of the wanted signal WS, for example as shown in equation 7.

$$[IIN, IQN] = dg\_r[IIP, -IQP] + dp\_r[IQP, IIP] \quad \text{[Equation 7]}$$

As expressed in equation 7, the vector of the image signal IS corresponds to a sum of two perpendicular vectors, e.g. dg_r[IIP, −IQP] and dp_r[IQP, IIP]. Therefore, the gain error dg_r and the phase error dp_r may be simply obtained through a vector operation, for example as expressed in equation 8.

$$dg\_r = ([IIN, IQN] \cdot [IIP, -IQP])/(IIP2 + IQP2)$$

$$dp\_r = ([IIN, IQN] \cdot [IQP, IIP])/(IIP2 + IQP2) \quad \text{[Equation 8]}$$

"·" represents a scalar product in equation 8. Operations expressed in equation 8 may be carried out by the controller 210. The controller 210 can transmit the control signals dp_rx and dg_rx corresponding to the obtained gain error dg_r and phase error dp_r to the Rx IQ imbalance compensator 240. The Rx IQ imbalance compensator 240 can compensate for the gain error dg_r and/or the phase error dp_r according to the control signals dp_rx and dg_rx, which can compensate for the Rx IQ imbalance.

Operations for measuring the Rx IQ imbalance and/or operations for compensating for the Rx IQ imbalance may include various embodiments. In one embodiment, the Rx IQ imbalance may be compensated for by repeating a process where the Rx IQ imbalance compensator 240 compensates for the Rx IQ imbalance. For example, the Rx IQ imbalance compensator 240 compensates for the Rx IQ imbalance (e.g., first Rx IQ imbalance) according to the control signals dp_rx and dg_rx, the derotator 250 and the DC estimator 260 receives the outputs HI and HQ of the Rx IQ imbalance compensator 240 to measure a remaining Rx IQ imbalance, and the Rx IQ imbalance compensator 240 compensates for the Rx IQ imbalance (e.g., remaining or second Rx IQ imbalance) according to new control signals dp_rx and dg_rx having the measured the Rx IQ imbalance (e.g., first Rx IQ imbalance) reflected thereto. In such an embodiment, an initial value of the control signals dp_rx and dg_rx transmitted to the Rx IQ imbalance compensator 240 may be (0, 0), a prescribed amount, a value corresponding to a gain error and a phase error measured in a manufacturing process of the transceiving circuit or the like. When the IQ imbalance is compensated for by the repetitive measurement and the compensation, the gain error dg_r and the phase error dp_r of an accurate value is not required to be obtained, and the gain error dg_r and the phase error dp_r may be obtained by equation 9.

$$dg\_r=([IIN,IQN]\cdot[IIP,-IQP])$$

$$dp\_r=([IIN,IQN]\cdot[IQP,IIP]) \quad \text{[Equation 9]}$$

Figure 7:
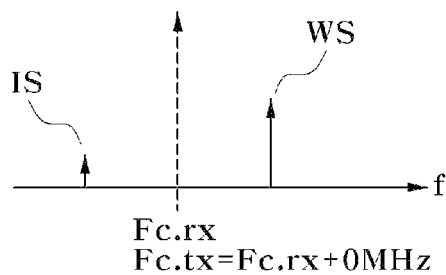
FIG. 7 is a diagram illustrating a principle for measuring a Tx/Rx IQ imbalance in accordance with the present general inventive concept.
Figure 7:
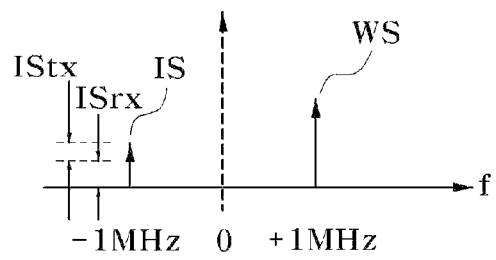
Figure 7:
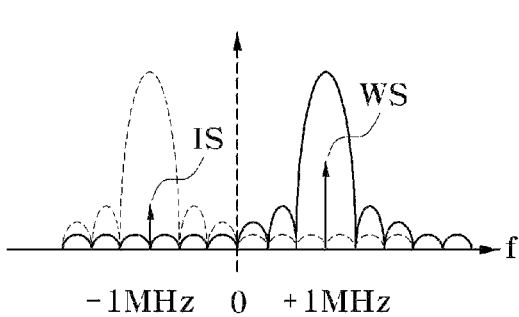
Figure 7:
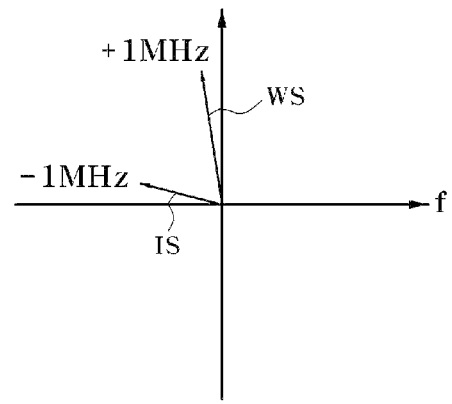

FIG. 7 is a diagram illustrating exemplary operations for measuring the Tx/Rx IQ imbalance in accordance with the present general inventive concept. An exemplary embodiment of a method for measuring the Tx/Rx IQ imbalance can be described using and may be applied to the embodiment of FIG. 1, however, such a method embodiment is not intended to be limited thereby.

In order to measure the Tx/Rx IQ imbalance, the rotator 220 generates the predetermined tone (e.g., the tone of 1 MHz in this embodiment), and the Tx IQ imbalance compensator 230 is not in operation, e.g. the rotator 220 carries out a rotation of a predetermined frequency ΔF. Thus, while the control signals rot_f, dp_tx and dg_tx are applied so that the Tx IQ imbalance is not compensated for in the Tx IQ imbalance compensator 230, test_I and test_Q of the DC component is outputted from the controller 210. Therefore, the IQ signals BI and BQ of the DC component are inputted to the IQ DAC 105. In addition, the control signal test_en is applied to the feedback switch 125 to form the feedback path, and a control signal aux_en is applied to the IQ switch 160 so that the output of the second local oscillator LO2 is inputted to the IQ up-conversion mixer 110. Moreover, the control signals dp_rx and dg_rx are applied so that the Rx IQ imbalance compensator 240 does not operate. The control signal drt_f is applied to the derotator 250 so that the derotator 250 outputs the IQ signals IIP and IQP obtained by derotating the input IQ signals HI and HQ by an amount of ΔF, and the IQ signals IIN and IQN obtained by derotating the input IQ signals HI and HQ by an amount of −ΔF.

FIG. 7(a) illustrates the output signal of the IQ up-conversion mixer 110. As shown, Fc.tx represents the frequency of the in-phase signal and the quadrature signal transmitted to the IQ up-conversion mixer 110, e.g. the output frequency F2 of the second local oscillator 155, and Fc.rx represents the frequency of the in-phase signal and the quadrature signal transmitted to the IQ down-conversion mixer 130, e.g. the output frequency F2 of the second local oscillator. Since the IQ signals CI and CQ of the predetermined tone are inputted to the IQ up-conversion mixer 110, the IQ output signals DI and DQ of the IQ up-conversion mixer 110 include the wanted signal WS and the image signal IS due to the Tx IQ imbalance.

FIG. 7(b) illustrates the output signal of the IQ down-conversion mixer 130. As shown, the desired signal WS is positioned at ΔF, e.g. 1 MHz, and the image signal IS is positioned at −ΔF, e.g. −1 MHz. The image signal IS corresponds to a sum of the image signal IStx due to the Tx IQ imbalance (e.g., the image signal generated in the IQ up-conversion mixer 110) and the image signal ISrx due to the Rx IQ imbalance (e.g., the image signal generated in the IQ down-conversion mixer 130), e.g. the image signal due to the Tx/Rx IQ imbalance. Therefore, when the output signal of the IQ down-conversion mixer 130 is derotated by the amount of ΔF, e.g. 1 MHz and the DC signal is then extracted, the wanted signal WS may be obtained. Moreover, when the output signal of the IQ down-conversion mixer 130 is derotated by the amount of −ΔF, e.g. 1 MHz and the DC signal is then extracted, the image signal IS may be obtained. The derotation and the extraction of the DC signal can be carried out by the derotator 250 and the DC estimator 260, respectively.

FIG. 7(c) illustrates an exemplary filter characteristic of the derotator 250 and the DC estimator 260. A solid line represents the filter characteristic in case of the derotation of by the amount of ΔF, e.g. +1 MHz, and a dotted line represents the filter characteristic in case of the derotation of by the amount of −ΔF, e.g. −1 MHz.

FIG. 7(d) illustrates exemplary vectors being outputted from the DC estimator 260, e.g. the vectors IIP and IQP of the wanted signal WS and the vectors IIN and IQN of the image signal IS. Similar to FIG. 6, the gain error dg_r and the phase error dp_r due to the Tx/Rx IQ imbalance may be obtained, for example as expressed in equation 10 or equation 11.

$$dg\_tr=([IIN,IQN]\cdot[IIP,-IQP])/(IIP2+IQP2)$$

$$dp\_tr=([IIN,IQN]\cdot[IQP,IIP])/(IIP2+IQP2) \quad \text{[Equation 10]}$$

$$dg\_tr=([IIN,IQN]\cdot[IIP,-IQP])$$

$$dp\_tr=([IIN,IQN]\cdot[IQP,IIP]) \quad \text{[Equation 11]}$$

When the gain error dg_r and the phase error dp_r due to the Rx IQ imbalance and the gain error dg_r and the phase error dp_r due to the Tx/Rx IQ imbalance are obtained, the gain error dg_r and the phase error dp_r due to the Tx IQ imbalance may be obtained from equation 12.

$$dg\_t=dg\_tr-dg\_r$$

$$dp\_t=dp\_tr-dp\_r \quad \text{[Equation 12]}$$

Figure 8:
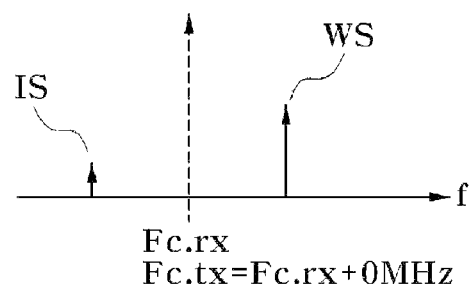
FIG. 8 is a diagram illustrating a principle for measuring a Tx IQ imbalance in accordance with the present general inventive concept.
Figure 8:
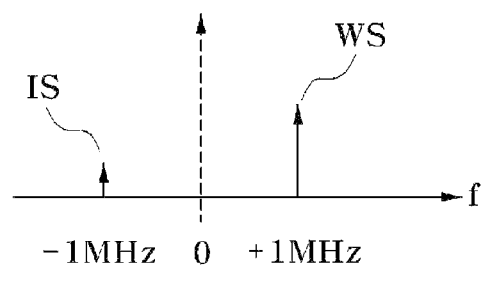
Figure 8:
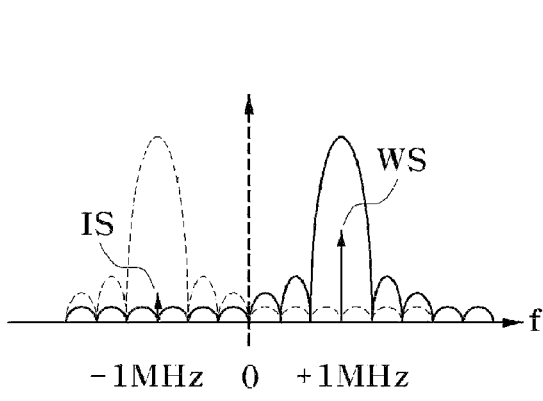
Figure 8:
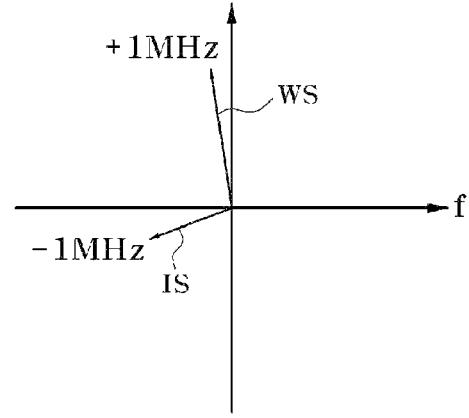

FIG. 8 is a diagram illustrating exemplary operations for measuring Tx IQ imbalance in accordance with the present general inventive concept. The exemplary embodiment of a method for measuring the Tx IQ imbalance can be described using and may be applied to the embodiment of FIG. 1, however, such a method embodiment is not intended to be limited thereby.

In order to measure the Tx IQ imbalance, the rotator 220 can generate a predetermined tone (e.g., the tone of 1 MHz in this embodiment), and test_I and test_Q of the DC component is outputted from the controller 210 while the Tx IQ imbalance compensator 230 is not in operation. Therefore, the IQ signals BI and BQ of the DC component are inputted to the IQ DAC 105. In addition, the control signal test_en is applied to the feedback switch 125 to form the feedback path, and the control signal aux_en is applied to the IQ switch 160 so that the output of the second local oscillator LO2 is inputted to the IQ up-conversion mixer 110. Moreover, the control signals dp_rx and dg_rx are applied so that the Rx IQ imbalance compensator 240 preferably compensates for the Rx IQ imbalance. The control signal drt_f is applied to the derotator 250 so that the derotator 250 outputs the IQ signals IIP and IQP obtained by derotating the input IQ signals HI and HQ by an amount of ΔF, and the IQ signals IIN and IQN obtained by derotating the input IQ signals HI and HQ by an amount of −ΔF.

FIG. 8(a) illustrates the output signal of the IQ up-conversion mixer 110. As shown, Fc.tx represents the frequency of the in-phase signal and the quadrature signal transmitted to the IQ up-conversion mixer 110, e.g. the output frequency F2 of the second local oscillator 155, and Fc.rx represents the frequency of the in-phase signal and the quadrature signal transmitted to the IQ down-conversion mixer 130, e.g. the output frequency F2 of the second local oscillator. Since the IQ signals CI and CQ of the predetermined tone are inputted to the IQ up-conversion mixer 110, the IQ output signals DI and DQ of the IQ up-conversion mixer 110 include the wanted signal WS and the image signal IS due to the Tx IQ imbalance.

FIG. 8(*b*) illustrates the output signal of the IQ down-conversion mixer 130. As shown, the desired signal WS is positioned at ΔF, e.g. 1 MHz, and the image signal IS is positioned at −ΔF, e.g. −1 MHz. The image signal IS corresponds to the image signal generated due to the Tx IQ imbalance (e.g., the image signal due to the Rx IQ imbalance is compensated for by the Rx IQ imbalance compensator 240). Therefore, when the output signal of the IQ down-conversion mixer 130 is derotated by the amount of ΔF, e.g. 1 MHz and the DC signal is then extracted, the wanted signal WS may be obtained. Moreover, when the output signal of the IQ down-conversion mixer 130 is derotated by the amount of −ΔF, e.g. 1 MHz and the DC signal is then extracted, the image signal IS may be obtained. The derotation and the extraction of the DC signal can be carried out by the derotator 250 and the DC estimator 260, respectively.

FIG. 8(*c*) illustrates an exemplary filter characteristic of the derotator 250 and the DC estimator 260. A solid line represents the filter characteristic in case of the derotation of by the amount of ΔF, e.g. +1 MHz, and a dotted line represents the filter characteristic in case of the derotation of by the amount of −ΔF, e.g. −1 MHz.

FIG. 8(*d*) illustrates exemplary vectors being outputted from the DC estimator 260, e.g. the vectors IIP and IQP of the wanted signal WS and the vectors IIN and IQN of the image signal IS. Similar to FIG. 6, the gain error dg_r and the phase error dp_r due to the Tx/Rx IQ imbalance may be obtained as expressed in equation 13 or equation 14.

$$dg\_t = ([IIN, IQN] \cdot [IIP, -IQP])/(IIP^2 + IQP^2)$$

$$dp\_t = ([IIN, IQN] \cdot [IQP, IIP])/(IIP^2 + IQP^2) \quad \text{[Equation 13]}$$

$$dg\_t = ([IIN, IQN] \cdot [IIP, -IQP])$$

$$dp\_t = ([IIN, IQN] \cdot [IQP, IIP]) \quad \text{[Equation 14]}$$

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of apparatus and/or methods according to the present general inventive concept have various advantages, for example, an IQ imbalance may be measured.

Embodiments for measuring the IQ imbalance can obtain an IQ imbalance by obtaining an image signal due to the IQ imbalance using a derotator and a DC estimator to measure the IQ imbalance using the same.

Embodiments for measuring an IQ imbalance in accordance with the application can obtain a desired or wanted signal and/or its image signal caused by the IQ imbalance without using the sharp analog filter.

Embodiments for measuring the IQ imbalance in accordance with the present application can rapidly and/or accurately measure an IQ imbalance, which can reduce a necessary time for measurement and compensation.

The apparatus for measuring the IQ imbalance in accordance with the present invention is advantageous in that the Tx IQ imbalance and the Rx IQ imbalance may be measured using the feedback path.

Although embodiments of the present general inventive concept have been illustrated and described, it would be appreciated by those skilled in the art that changes may be made in these embodiments without departing from the principles and spirit of the general inventive concept, the scope of which is defined in the claims and their equivalents. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. An apparatus for measuring an in-phase and quadrature (IQ) imbalance, the apparatus comprising:
    a signal generator to provide a first IQ signal of a DC component during a first period and the first IQ signal of a first angular frequency during a second period;
    an IQ up-conversion mixer to up-convert the first IQ signal by a second angular frequency during the first period and up-convert the first IQ signal by a third angular frequency during the second period to output a second IQ signal;
    an IQ down-conversion mixer to down-convert a sum of an I component and a Q component of the second IQ signal by the third angular frequency to output a third IQ signal; and
    an IQ imbalance detector to obtain an Rx IQ imbalance from the third IQ signal during the first period and a Tx/Rx IQ imbalance from the third IQ signal during the second period.

2. The apparatus in accordance with claim 1, further comprising:
    a first local oscillator to provide a first LO signal of the second angular frequency;
    a second local oscillator to provide a second LO signal of the third angular frequency to the IQ down-conversion mixer; and
    an IQ switch to provide the first LO signal to the IQ up-conversion mixer during the first period and the second LO signal to the IQ up-conversion mixer during the second period.

3. The apparatus in accordance with claim 2, further comprising:

a power amplifier to amplify a sum of an I component and a Q component of the second IQ signal during a normal operating period to generate a Tx RF signal to be transmitted to an antenna;

a low noise amplifier to amplify an Rx RF signal transmitted from the antenna to be transmitted to the IQ down-conversion mixer during the normal operating period; and a feedback switch to feed back the sum of the I component and the Q component of the second IQ signal to the IQ down-conversion mixer during the first period and the second period and prevent the feedback during the normal operating period, wherein the IQ switch is configured to provide the second LO signal to the IQ up-conversion mixer during the normal operating period.

4. The apparatus in accordance with claim 2, wherein a single clock is divided to be transmitted to the first local oscillator, the second local oscillator and the IQ imbalance detector.

5. The apparatus in accordance with claim 1, wherein the signal generator comprises a rotator to output an IQ signal of the DC component without a rotation during the first period and output the IQ signal rotated by an amount of the first angular frequency.

6. The apparatus in accordance with claim 1, further comprising:

a derotator to output a fourth IQ signal and a fifth IQ signal obtained by respectively derotating the third IQ signal by amounts of [the second angular frequency–the third angular frequency] and [the third angular frequency–the second angular frequency] during the first period, and to output the fourth IQ signal and the fifth IQ signal obtained by respectively derotating the third IQ signal by amounts of [the first angular frequency] and –[the first angular frequency] during the second period;

a DC estimator to obtain a sixth IQ signal corresponding to a DC component of the fourth signal and a seventh IQ signal corresponding to a DC component of the fifth IQ signal; and a controller to obtain the Rx IQ imbalance from the sixth IQ signal and the seventh IQ signal during the first period and to obtain the Tx/Rx IQ imbalance from the sixth IQ signal and the seventh IQ signal during the second period.

7. The apparatus in accordance with claim 6, wherein the derotator outputs I4 corresponding to [I3×cos($\Delta\omega$xt)–Q3×sin($\Delta\omega$xt)]; Q4 corresponding to [I3×sin($\Delta\omega$xt)+Q3×cos($\Delta\omega$xt)]; I5 corresponding to [I3×cos($\Delta\omega$xt)+Q3×sin($\Delta\omega$xt)]; and Q5 corresponding to [–I3×sin($\Delta\omega$xt)+Q3×cos($\Delta\omega\Delta$t)], where I3 and Q3 are an I component signal and a Q component signal of the third IQ signal, respectively, I4 and Q4 are an I component signal and a Q component signal of the fourth IQ signal, respectively, I5 and Q5 are an I component signal and a Q component signal of the fifth IQ signal, respectively, and $\Delta\omega$ corresponds to [the second angular frequency–the third angular frequency] and [the first angular frequency] during the first period and the second period, respectively.

8. The apparatus in accordance with claim 6, further comprising a temperature sensor, wherein the IQ imbalance detector is configured to repeatedly perform the measurement of the IQ imbalance according to a temperature measured by the temperature sensor, and wherein the DC estimator comprises an accumulator or a low pass filter.

9. The apparatus in accordance with claim 6, wherein the controller obtains a phase error corresponding to [(I6×Q7+Q6×I7)÷(I6$^2$+Q6$^2$)] and a gain error corresponding to [(I6×I7–Q6×Q7)÷(I6$^2$+Q6$^2$)], where I6 and Q6 are an I component signal and a Q component signal of the sixth IQ signal, respectively, I7 and Q7 are an I component signal and a Q component signal of the seventh IQ signal, respectively, the phase error and the gain error obtained during the first period correspond to a phase error and a gain error of the Rx IQ imbalance, respectively, and the phase error and the gain error obtained during the second period correspond to a phase error and a gain error of the Tx/Rx IQ imbalance.

10. The apparatus in accordance with claim 6, wherein the controller obtains a phase error corresponding to [(I6×Q7+Q6×I7)] and a gain error corresponding to [(I6×I7–Q6×Q7)], where I6 and Q6 are an I component signal and a Q component signal of the sixth IQ signal, respectively, I7 and Q7 are an I component signal a Q component signal of the seventh IQ signal, respectively, the phase error and the gain error obtained during the first period correspond to a phase error and a gain error of the Rx IQ imbalance, respectively, and the phase error and the gain error obtained during the second period correspond to a phase error and a gain error of the Tx/Rx IQ imbalance.

11. The apparatus in accordance with claim 1, wherein a Tx IQ imbalance is obtained from an equation [the Tx IQ imbalance=the Tx/Rx IQ imbalance–the Rx IQ imbalance].

12. The apparatus in accordance with claim 1, further comprising:

an Rx IQ imbalance compensator to output a fourth IQ signal corresponding to the third IQ signal, wherein the fourth signal has an Rx IQ imbalance of the third signal compensated for during the second period;

wherein the IQ imbalance detector is configured to obtain the Rx IQ imbalance froth the fourth IQ signal during the first period and a Tx IQ imbalance from the fourth IQ signal during the second period.

13. The apparatus in accordance with claim 12, further comprising:

a derotator to output a fifth IQ signal and a sixth IQ signal obtained by derotating the fourth IQ signal by amounts of [the second angular frequency–the third angular frequency] and [the third angular frequency–the second angular frequency] during the first period, respectively, and to output the fifth IQ signal and the sixth IQ signal obtained by derotating the fourth IQ signal by amounts of [the first angular frequency] and –[the first angular frequency] during the second period, respectively;

a DC estimator to obtain a seventh IQ signal corresponding to a DC component of the fifth IQ signal and a eighth IQ signal corresponding to a DC component of the sixth signal; and a controller to obtain the Rx IQ imbalance from the seventh IQ signal and the eighth IQ signal during the first period and the Tx IQ imbalance from the seventh IQ signal and the eighth IQ signal during the second period.

14. The apparatus in accordance with claim 13, wherein the derotator outputs I5 corresponding to [I4×cos($\Delta\omega\Delta$t)–Q4×sin($\Delta\omega\Delta$t)]; Q5 corresponding to [I4×sin($\Delta\omega$xt)+Q4×cos($\Delta\omega$xt)]; I6 corresponding to [I4×cos($\Delta\omega$xt)+Q4×sin($\Delta\omega\Delta$t)]; and Q6 corresponding to [–I4×sin($\Delta\omega$xt)+Q4×cos($\Delta\omega$xt)], where I4 and Q4 are an I component signal and a Q component signal of the fourth IQ signal, respectively, I5 and Q5 are an I component signal and a Q component signal of the fifth IQ signal, respectively, I6 and Q6 are an I component signal and a Q component signal of the sixth IQ signal, respectively, and $\Delta\omega$ corresponds to [the second angular frequency–the third angular frequency] and [the first angular frequency] during the first period and the second period, respectively.

15. The apparatus in accordance with claim 14, wherein the controller obtains a phase error corresponding to $[(I7 \times Q8 + Q7 \times I8) \div (I7^2 + Q7^2)]$ and a gain error corresponding to $[(I7 \times I8 - Q7 \times Q8) \div (I7^2 + Q7^2)]$, where I7 and Q7 are an I component signal and a Q component signal of the seventh IQ signal, respectively, I8 and Q8 are an I component signal and a Q component signal of the eighth IQ signal, respectively, the phase error and the gain error obtained during the first period correspond to a phase error and a gain error of the Rx IQ imbalance, respectively, and the phase error and the gain error obtained during the second period correspond to a phase error and a gain error of the Tx IQ imbalance.

16. The apparatus in accordance with claim 14, wherein the controller obtains a phase error corresponding to $[(I7 \times Q8 + Q7 \times I8)(I7^2 + Q7^2)]$ and a gain error corresponding to $[(I7 \times I8 - Q7 \times Q8) \div (I7^2 + Q7^2)]$, where I7 and Q7 are an I component signal and a Q component signal of the seventh IQ signal, respectively, I8 and Q8 are an I component signal and a Q component signal of the eighth IQ signal, respectively, the phase error and the gain error obtained during the first period correspond to a phase error and a gain error of the Rx IQ imbalance, respectively, and the phase error and the gain error obtained during the second period correspond to a phase error and a gain error of the Tx IQ imbalance.

17. The apparatus in accordance with claim 12, wherein the Rx IQ imbalance compensator compensates for the Rx IQ imbalance during the second period according to the Rx IQ imbalance obtained during the first period by the IQ imbalance detector.

18. A method for measuring an in-phase and quadrature (IQ) imbalance, comprising:
providing a first IQ signal of a DC component during a first period and providing the first IQ signal of a first angular frequency during a second period;
up-converting the first IQ signal of the DC component by a second angular frequency during the first period and up-converting the first IQ signal by a third angular frequency during the second period to output a second IQ signal;
down-converting a sum of an I component and a Q component of the second IQ signal by the third angular frequency to output a third IQ signal; and
determining an Rx IQ imbalance from the third IQ signal during the first period and a Tx/Rx IQ imbalance from the third IQ signal during the second period.

19. An apparatus to measure an in-phase and quadrature (IQ) imbalance, comprising:
an IQ up-conversion mixer to up-convert a first IQ signal of a first angular frequency by a second angular frequency during a first period to output a second IQ signal;
an IQ down-conversion mixer to down-convert a sum of an I component and a Q component of the second IQ signal by the second angular frequency to output a third IQ signal; and
an IQ imbalance detector to determine an IQ imbalance from the third IQ signal during the first period, and to determine a different type of IQ imbalance from the third IQ signal during a second period.

20. The apparatus of claim 19, comprising:
an Rx IQ imbalance compensator to receive the third IQ signal and to compensate an Rx IQ imbalance of the third IQ signal to output a fourth IQ signal, and wherein the IQ imbalance detector is configured to obtain a Tx IQ imbalance from the fourth IQ signal.

21. The apparatus of claim 19, wherein the determined IQ imbalance during the first period is an Rx IQ imbalance, and the determined IQ imbalance during the second period is a Tx/Rx imbalance.

\* \* \* \* \*